(12) United States Patent
Chalfin et al.

(10) Patent No.: US 6,879,948 B1
(45) Date of Patent: Apr. 12, 2005

(54) SYNCHRONIZATION OF HARDWARE SIMULATION PROCESSES

(75) Inventors: Alex Chalfin, Mountain View, CA (US); Jeffrey Daudel, Santa Clara, CA (US); Mark Grossman, Palo Alto, CA (US); Shrijeet Mukherjee, Mountain View, CA (US); Peter Ostrin, Sunnyvale, CA (US); Jarrett Redd, San Jose, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/459,995

(22) Filed: Dec. 14, 1999

(51) Int. Cl.$^7$ .............................................. G06F 17/50
(52) U.S. Cl. ........................................... 703/14; 716/6
(58) Field of Search .............................. 703/14, 19, 28; 716/6, 1, 5, 18; 709/104, 218, 219, 220, 221, 202, 107, 400, 314

(56) References Cited

U.S. PATENT DOCUMENTS

| | | | | |
|---|---|---|---|---|
| 4,918,652 A | * | 4/1990 | Bennington et al. | 713/400 |
| 5,081,601 A | * | 1/1992 | Eirikasson | 703/17 |
| 5,363,319 A | * | 11/1994 | Okuda | 703/15 |
| 5,603,015 A | * | 2/1997 | Kurosawa et al. | 703/15 |
| 5,678,028 A | * | 10/1997 | Bershteyn et al. | 703/22 |
| 5,732,247 A | * | 3/1998 | Dearth et al. | 703/13 |
| 5,768,567 A | * | 6/1998 | Klein et al. | 703/13 |
| 5,790,829 A | * | 8/1998 | Flynn | 703/17 |
| 5,848,236 A | * | 12/1998 | Dearth et al. | 714/33 |
| 5,905,883 A | * | 5/1999 | Kasuya | 703/17 |
| 5,987,243 A | * | 11/1999 | Aihara | 703/17 |
| 6,028,996 A | | 2/2000 | Sniderman et al. | 395/500.49 |
| 6,099,579 A | * | 8/2000 | Dowling et al. | 716/6 |
| 6,115,823 A | * | 9/2000 | Velasco et al. | 713/322 |
| 6,233,540 B1 | * | 5/2001 | Schaumont et al. | 703/14 |

OTHER PUBLICATIONS

Sarkar S., Basu A., Majumdar A., "Synchronization of Commincating Modules and Processes in High Level Synthesis" IEEE, 1995, pp. 87–92.*

(Continued)

*Primary Examiner*—Kevin J. Teska
*Assistant Examiner*—Dwin M. Craig
(74) *Attorney, Agent, or Firm*—Sterne, Kessler, Goldstein & Fox PLLC

(57) ABSTRACT

A system, method, and computer program product is presented for simulating a system of hardware components. Each component is simulated in a hardware definition language such as VERILOG. Each component is represented as a simulated device under test (DUT) that is incorporated into a simulation module. The invention synchronizes the simulation modules by issuing clock credit to each simulation module. Each simulation module can only operate when clock credit is available, and can only operate for some number of clock cycles corresponding to the value of the clock credit. Operation is said to consume the clock credit. After a simulation module has consumed its clock credit, its DUT halts. Once every simulation module has consumed its clock credit and halted, another clock credit can be issued. This allows checkpointing of the operation of each DUT and simulates parallelism of the DUTs using executable images of manageable size. A given DUT can include two or more subsets of logic that each require a clock signal having a different rate. Such subsets of the logic of a DUT are referred to as clock domains. The appropriate clock signals are created by a test bench component of the simulation module. The test bench creates a master clock signal for the DUT. The test bench then divides this clock signal to produce clock signals applied to the clock domains of the DUT. The test bench can be created through automated means by providing a system specification that defines the inputs (including clocks) and outputs of a DUT. This allows a test bench specific to the DUT to be created.

12 Claims, 9 Drawing Sheets

OTHER PUBLICATIONS

Hermannsson Gudjon; Wittie Larry, "Optimistic Synchronization in Distributed Shared Memory", IEEE 1994, pp. 345–354.*

Hirsch Herb, Chawla Praveen, Carter Harold W., "Parallel Simulation of VHDL–AMS Models", IEEE 1998, pp. 545–551.*

Gupta Rajesh K, Coelho Claudionor N., Micheli Giovanni, "Synthesis and Simulation of Digital Systems Containing Interacting Hardware and Software Components", IEEE 1992, pp. 225–230.*

"Microsoft Press Computer Dictionary", Third Edition; Microsoft Press, Copyright 1997 (pp.—4,81, 82, 107, 145, 146, 182, 183, 201 and 430).*

Skahill Kevin, "VHDL for Programmable Logic", Addison–Wesley, 1996, ISBN 0–201–89573–0, pp. 541–543.*

* cited by examiner

SYNCHRONIZATION OF HARDWARE SIMULATION PROCESSES

BACKGROUND OF THE INVENTION

1. Field of the Invention

The present invention pertains to electronic system design, and more particularly to the simulation of digital circuitry.

2. Related Art

The process of designing and testing digital circuitry typically includes software simulation of the circuitry. Simulation takes place prior to development of a physical prototype, and allows economical testing of the logic of a circuit. Test vectors serve as inputs to the simulated circuitry, and the outputs are analyzed as a way of verifying the accuracy of the design.

A problem arises when a large amount of circuitry needs to be simulated. Simulation of a large circuit requires a large executable image, which can exceed the memory capacity of a simulation environment. Simulation of a system of circuits, such as a system of interoperating chips that perform in parallel, leads to the same problem. Current simulation methods deal with the image size problem by simulating a subset of the circuitry in any given test. Simulation of a system of the circuitry creates an executable image having a more manageable size. By simulating a system portion by portion, all components of the system can be tested. This creates some confidence in the accuracy of the logic of the overall system, but the value of such testing is limited. The system is never tested as a single entity, so that some doubt will remain as to the ability of the overall system to function as intended. As well as being incomplete, such testing is slow and costly. A simulation must be developed and executed for each of several subsets of the logic. Moreover, the identification of the appropriate subsets to be simulated can be difficult and time consuming.

In addition, the actual simulation of a system of components can be time consuming. Such a simulation typically proceeds sequentially, that is, step by step. At each step, a determination must be made as to which component(s) has (have) work to be done. The operation of the components must then be simulated, one component at a time. If the simulation of each component is viewed as a computational thread, then the simulation of a system of components, using current simulation methods, requires sequential execution of multiple threads. This is equivalent to the creation of a single large computational thread. While there are compilers that can parallelize simulations across multiple processors, their ability to perform load balancing and handle the different clocking requirements of multiple components is limited.

Hence, there is a need for a way to simulate a system of digital components, where the simulation is both efficient and logically comprehensive.

SUMMARY OF THE INVENTION

The invention described herein is a system, method, and computer program product for simulating a system of hardware components. Each component simulated is described in a hardware definition language such as VERILOG or another high-level programming language sufficient to describe a hardware device. Each component is represented as a simulated device under test (DUT) that is incorporated into a simulation module. Each simulation module can execute as an independent thread in parallel with all other simulation modules. The invention synchronizes the simulation modules by issuing clock credit to each simulation module. Each simulation module can only operate when clock credit is available, and can only operate for some number of clock cycles corresponding to the value of the clock credit. Operation is said to consume the clock credit. After a simulation module has consumed its clock credit, its DUT halts. Once every simulation module has consumed its clock credit and halted, another clock credit can be issued. This allows checkpointing of the operation of each DUT and simulates parallelism of the DUTs using executable images of manageable size.

A given DUT can include two or more subsets of logic that each require a clock signal having a different rate. Such subsets of the logic of a DUT are referred to as clock domains. The appropriate clock signals are generated by a test bench component of the simulation module. The test bench creates a master clock signal for the DUT. The test bench then divides this clock signal to produce clock signals applied to the clock domains of the DUT. The test bench can be created through automated means. Given a system specification that defines the inputs (including clocks) and outputs of a DUT, a test bench specific to the DUT can be created.

Features and Advantages

The invention described herein can provide clock signals of different rates to different clock domains of an individual DUT during simulation. The invention has the additional feature of being able to create a test bench that manages inputs and outputs specifically for a particular DUT during simulation. The invention has the additional feature of being able to simulate a system of DUTs while maintaining synchronization of the DUTs.

The invention has the advantage of simulating a complete system of DUTs without creating a single, excessively large executable image. The invention has the further advantage of simulating a system of DUTs in a relatively fast, efficient manner. In addition, the invention permits the simulation of an arbitrarily large number of DUTs in parallel.

BRIEF DESCRIPTION OF THE FIGURES

The foregoing and other features and advantages of the invention will be apparent from the following, more particular description of a preferred embodiment of the invention, as illustrated in the accompanying drawings.

DETAILED DESCRIPTION OF THE PREFERRED EMBODIMENTS

Figure 1:
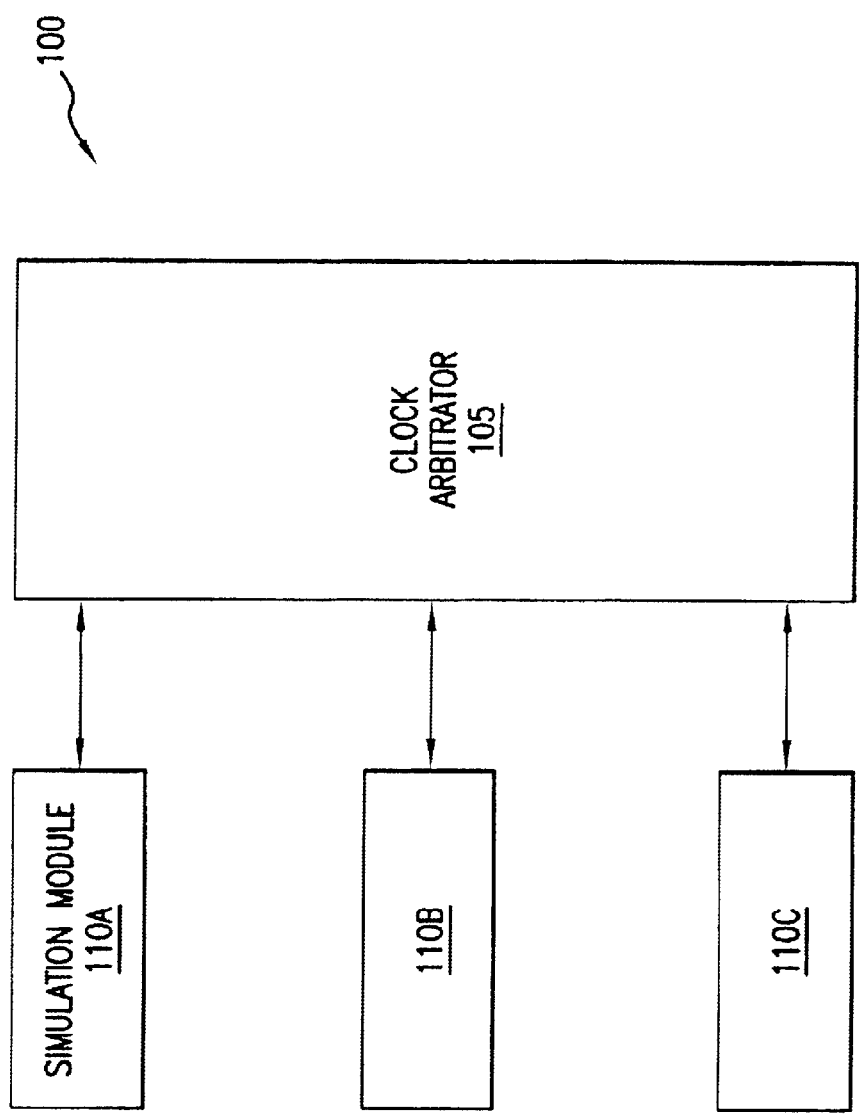
FIG. 1 is a block diagram generally illustrating the structure of an embodiment of the invention.

A preferred embodiment of the present invention is now described with reference to the figures where like reference numbers indicate identical or functionally similar elements. Also in the figures, the left most digit of each reference number corresponds to the figure in which the reference number is first used. While specific configurations and arrangements are discussed, it should be understood that this is done for illustrative purposes only. A person skilled in the relevant art will recognize that other configurations and arrangements can be used without departing from the spirit and scope of the invention. It will be apparent to a person skilled in the relevant art that this invention can also be employed in a variety of other devices and applications.

Contents
- I. Terminology
- II. Overview
- III. System
- IV. Method
- V. Environment
- VI. Conclusion

I. Terminology

The following section defines several terms that occur frequently throughout the application.

VERILOG is a language for simulation of digital circuitry and is an IEEE standard.

Device under test (DUT) refers to a block of VERILOG code (or other hardware simulation language) that, when executed, simulates a digital circuit or a portion thereof for testing purposes. The device may be a chip, for example, or a subset of the logic on the chip.

Test bench refers to code that is ancillary to the DUT but operates in conjunction with the DUT. The test bench manages all inputs and outputs of the DUT, including clock signals, and can be written in VERILOG.

Programming language interface (PLI) is a body of code that interfaces the test bench with the rest of the system context that hosts the DUT during simulation. If the testbench is written in VERILOG and the surrounding system is written in C, the PLI serves as a VERILOG to C bridge.

Simulation module refers to the aggregate body of code that includes a DUT, the test bench for the DUT, and the associated PLI.

Clock credit is a token issued to a simulation module and having a numerical value, permitting the DUT to execute for some number of clock cycles associated with the value of the clock credit. Execution stops after the clock cycles have been used.

Clock domain refers to a portion of a DUT in which the circuitry is clocked at the same clock rate. A DUT may contain one or more distinct clock domains having different clock rates.

II. Overview

The invention described herein provides a system, method, and computer program product for the simulation of a system of hardware components, where the actual components operate in parallel. The invention provides a way to synchronize all of the components, thereby simulating operation of the complete system. Each component simulated is defined using the VERILOG programming language, or some other hardware simulation language. For each component, the VERILOG code is incorporated, along with additional support code, in a single simulation module. A clock arbitrator issues a clock credit to each simulation module. This permits each simulation module to perform an amount of processing corresponding to the value of the clock credit. Once this amount of processing is completed, a given simulation module must halt. Once all the simulation modules have halted, then each simulation module has effectively consumed its clock credit. Further processing may not take place until the clock arbitrator issues an additional clock credit. This enables the clock arbitrator to maintain synchronization of each simulation module. This permits synchronized simulation of the complete system.

Each simulation module includes a test bench. A test bench consists of VERILOG code developed specifically for an associated component. If a given DUT contains two or more clock domains operating at distinct clock rates, the test bench serves to provide a clock signal with the appropriate clock rate to the appropriate domain of the DUT. Hence, the test bench serves to manage disparate clock rates on a given DUT. The testbench can also provide a means for interconnecting the interfaces of different DUTs. Note that a test bench can be created in an automated manner. This can be done by automated traversal of a machine-readable system design specification, identifying a DUT, and ascertaining the interfaces to the DUT.

III. System

Figure 2:
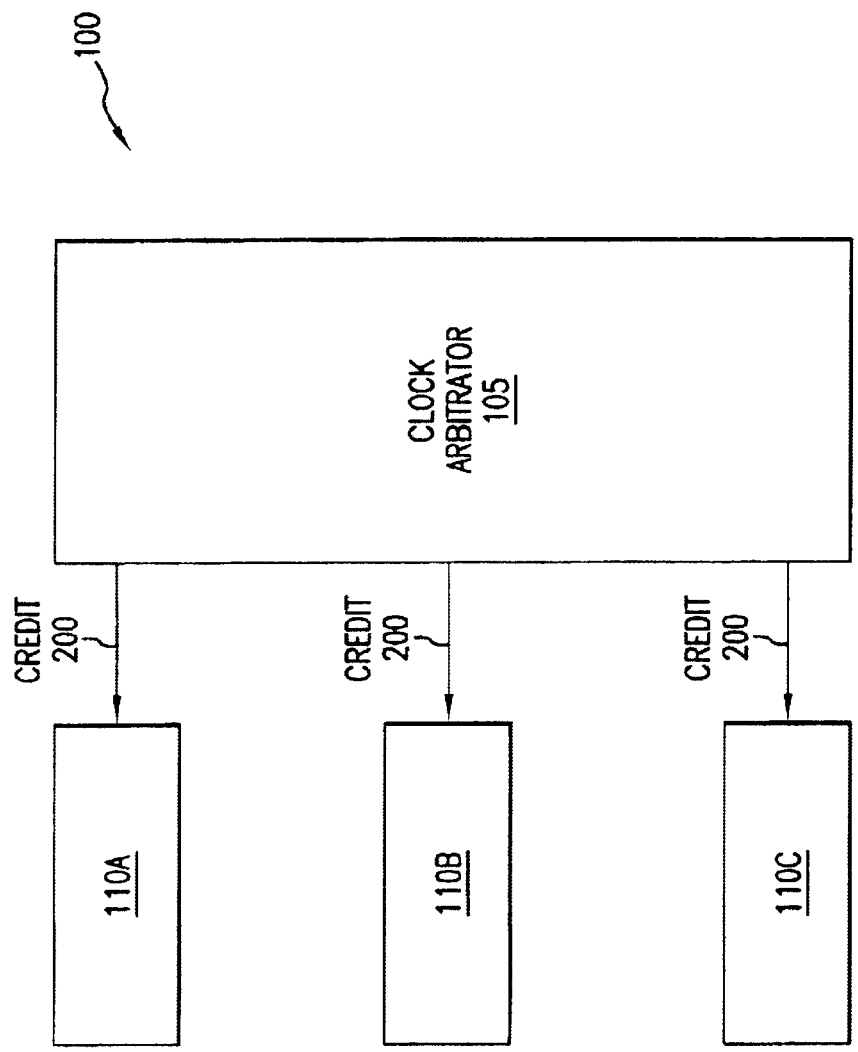
FIG. 2 illustrates the issuance of clock credit, according to an embodiment of the invention.

The simulation environment is illustrated in general in FIG. 1. A clock arbitrator 105 is shown in relation to a plurality of simulation modules 110A through 110C. Clock arbitrator 105 is responsible for maintaining synchronization of the simulated system. Maintaining synchronization entails coordinating the processing of each DUT. As will be described in greater detail below, synchronization is maintained by issuance of clock credit. This is illustrated in greater detail in FIG. 2. Clock arbitrator 105 is shown issuing a clock credit 200 to each of simulation modules 110A through 110. Upon receipt of a clock credit 200, each simulation module allows its DUT to operate. Operation proceeds for a number of clock cycles corresponding to the value of clock credit 200. Once this is completed, clock credit 200 is considered to be consumed, and operation of the DUT halts. Once all the simulation modules have consumed their respective clock credits, then clock arbitrator can issue additional clock credit as necessary. Clock arbitrator 105 can be embodied in either software, firmware, or hardware. In an embodiment of the invention, clock arbitrator 105 is incorporated in a larger interface. This interface may include shared memory, and, in general, serves to represent the larger system within which the DUTs operate. In an embodiment of the invention, the shared memory serves to relay data between DUTs, so that data flows through the shared memory. Clock arbitrator 105 can identify synchronization points in the data flowing through the shared memory, that is, points in the data flow at which the DUTs must be synchronized. As a result, clock arbitrator 105 issues clock credit to the DUTs until a synchronization point is reached. Clock arbitrator 105 then stops issuing clock credit so that the DUTs halt at the synchronization point. Once the DUTs have halted, clock credit can be issued once again. This maintains synchronization of the DUTs.

Figure 3:
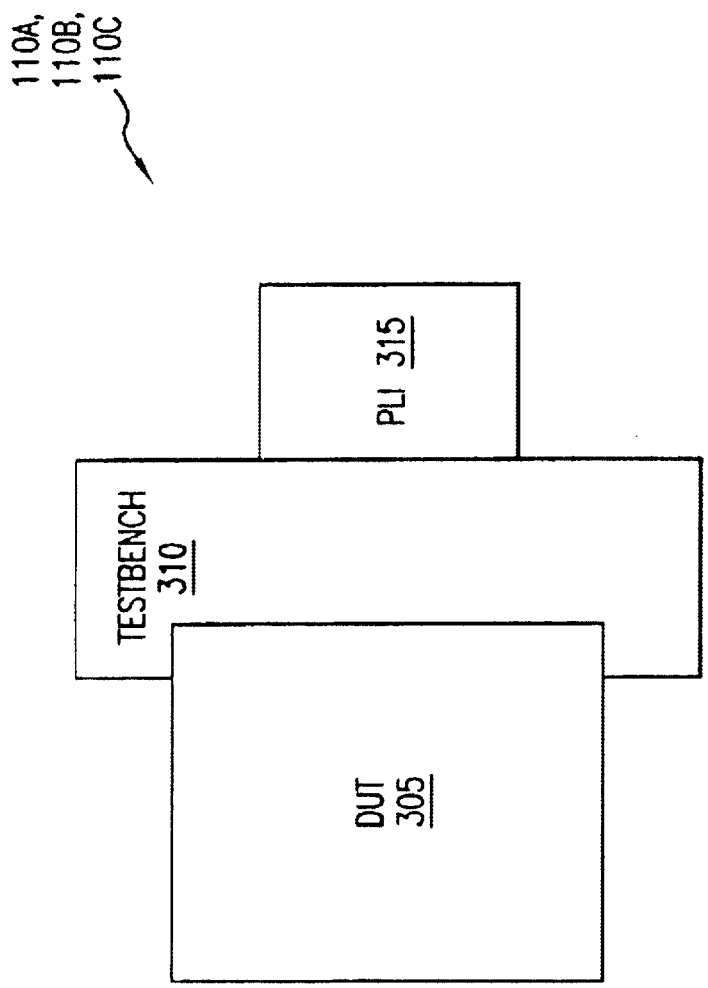
FIG. 3 illustrates the logical structure of a simulation module, according to an embodiment of the invention.

Simulation modules are illustrated in greater detail in FIG. 3. A given simulation module includes a DUT 305. DUT 305 includes code that, when executed, simulates the operation of the physical circuit corresponding to DUT 305. The component represented by DUT 305 can be a chip, for example. DUT 305 can also be some subset of the logic contained on a chip. DUT 305 can be written in VERILOG or an alternative hardware simulation language. DUT 305 can also be written in a high-level simulation language, such as C, for faster operation. Like the circuitry that it simulates, DUT 305 requires a set of inputs and one or more clock signals. DUT 305 also produces one or more output signals. Note that some system components may not be undergoing testing, but must nonetheless be simulated in order to fully simulate the dynamic behavior of the system. Such components can be modeled in a language such as C.

The clock signals, input signals, and output signals associated with DUT 305 are managed by a test bench 310. It is the responsibility of test bench 310 to provide input and clock signals to DUT 305 and to accept outputs produced by DUT 305. Because DUT 305 may include multiple clock domains, test bench 310 provides the necessary clock signal for each clock domain of DUT 305. Test bench 310 first creates a clock signal having a clock rate equivalent to the least common multiple of the clock rates required by the clock domains of DUT 305. This clock signal is referred to as the master clock signal. Clock signals for the various clock domains of DUT 305 are created by test bench 310. These clock rates are created by dividing the master clock rate. If, for example, a clock domain requires a 25 megahertz (MHz) clock signal while another clock domain requires a 20 MHz clock signal, a master clock signal having a frequency of 100 MHz will first be created. The 25 and 20 MHz signals are created by test bench 310 signal by dividing the 100 MHz signal by four and five, respectively. It is the responsibility of test bench 310 to create the needed clock signals by creating and manipulating the master clock signal.

Note that in some cases, the master clock signal will have a clock rate equal to the clock rate needed by one of the clock domains. Given two clock domains needing clock signals of 100 and 50 MHz, respectively, the master clock signal will have a clock rate of 100 MHz. In such a case, the master clock signal will be applied to the clock domain requiring that frequency.

Given the requirement that test bench 310 must manage all inputs and outputs of DUT 305, test bench 310 must be created specifically for DUT 305. Such a tailor-made test bench can be created by automated means. If, for example, a system of devices is specified in detail in a system database, test benches can be created by traversing the database, identifying the specific DUTs, and ascertaining the interfaces for each device. The interface information (that is, the inputs, outputs, clock signals, and protocols for the device) can then be used to create a test bench specific for each component. The test bench can then be created in VERILOG, and compiled along with the VERILOG code representing the DUT, to create a single executable module.

A given simulation module also includes a programming language interface (PLI) 315. The function of the PLI 315 is to accept clock credit from a clock arbitrator and to enable the DUT 305 to operate for a number of clock cycles corresponding to the value of the received clock credit. Once DUT 305 has completed operation for that number of clock cycles, PLI 315 halts DUT 305. Operation of DUT 305 remains suspended until PLI 315 receives additional clock credit from the clock arbitrator. In an embodiment of the invention, a clock credit having a value of one corresponds to one clock cycle in DUT 305.

IV. Method

The method of the present invention includes the issuance of clock credit from a clock arbitrator to simulation modules. Each simulation module then executes for a number of clock cycles corresponding to the value of the received clock credit. Once a simulation module has completed execution of these clock cycles, its processing must halt pending receipt of additional clock credit. No further clock credit is issued until each simulation module has completed its allotted clock cycles. Within each simulation module, one or more clock signals are provided to the DUT. The test bench creates a master clock signal and creates slower clock signals by dividing the master clock signal appropriately.

Figure 4:
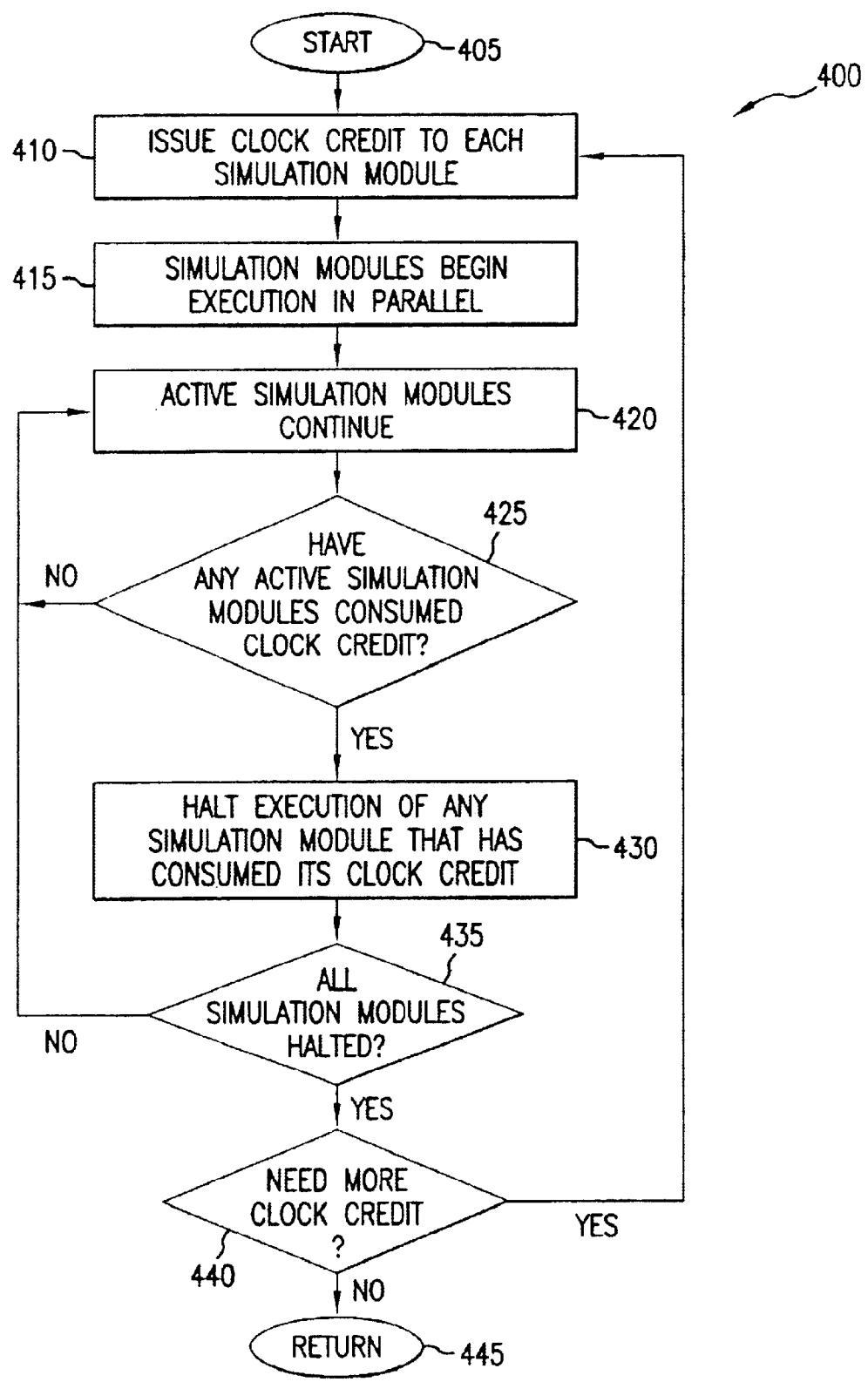
FIG. 4 is a flowchart illustrating the process of synchronizing simulation modules, according to an embodiment of the invention.

The process of issuing clock credit and synchronizing simulation modules is illustrated in greater detail in FIG. 4, process 400. The process begins with a step 405. In a step 410, the clock arbitrator issues a clock credit to each simulation module. The DUT in each simulation module can then execute for a number of clock cycles corresponding to the value of the received clock credit. In a step 415, the simulation modules begin execution in parallel. In a step 420, any active (i.e., executing) simulation module continues to execute. In a step 425, a determination is made as to whether the DUT of any simulation module has completed a number of clock cycles corresponding to the value of the received clock credit. If not, then the simulation modules continue execution in step 420. If the DUT of any simulation module has completed a number of clock cycles corresponding to the value of the received clock credit, then process 400 continues at a step 430. In step 430, execution of any DUT that has consumed its clock credit is halted. The corresponding simulation module is therefore no longer active. In a step 435, a determination is made as to whether all simulation modules have halted. If not, then process 400 continues at step 420. In step 420, any active simulation modules continue to execute. In this manner, the DUT of each simulation module executes only for a number of clock cycles corresponding to the value of the issued clock credit. Once all simulation modules have halted, then in a step 440, a determination is made as to whether additional clock credit must be issued to the system of simulation modules. If so, process 400 continues at step 410, and process 400 repeats. Otherwise, process 400 concludes at step 445.

When all of the simulation modules have completed an amount of processing corresponding to the value of the clock credit, then in step 435, index value i is equal to n, and processing continues in a step 445. In step 445, a determination is made as to whether additional clock credit is required. If so then the process returns to step 410 where additional clock credit is issued to each simulation module. Otherwise process 400 concludes at a step 450. In this manner, additional clock credit is only issued after each simulation module has completed an appropriate amount of processing. This permits a clock arbitrator to maintain synchronization of a plurality of simulation modules, corresponding to a respective plurality of DUTs.

Figure 5:
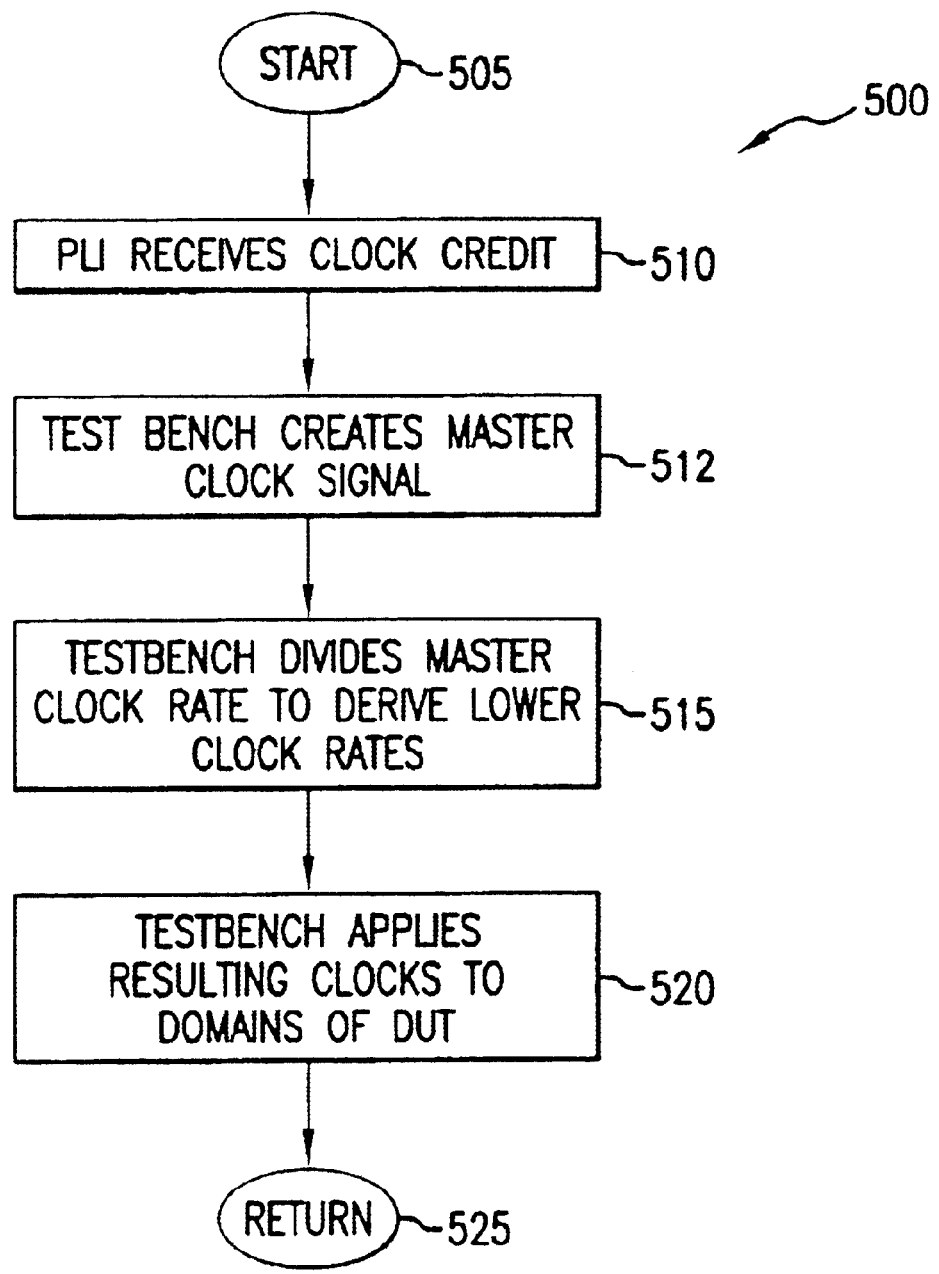
FIG. 5 is a flowchart illustrating the creation of clock signals for clock domains within a DUT, according to an embodiment of the invention.

Within any given simulation module, appropriate clock signals must be provided to the DUT. Moreover, different clock domains within a single DUT may require different clock rates. The provision of the requisite clock signals for a single DUT is described in greater detail in process 500 of FIG. 5. The process begins with a step 505. In a step 510, the PLI associated with a given DUT receives clock credit from the clock arbitrator. In a step 512, the test bench creates a master clock signal. The master clock signal has a clock rate equal to the least common multiple of the clock rates required by the clock domains of the DUT. In a step 515, the test bench divides the master clock signal as necessary to derive the clock signals required by the domains of the DUT. In a step 520, the test bench applies the resulting clock signals to the appropriate domains of the DUT. The process concludes with a step 525.

Figure 6:
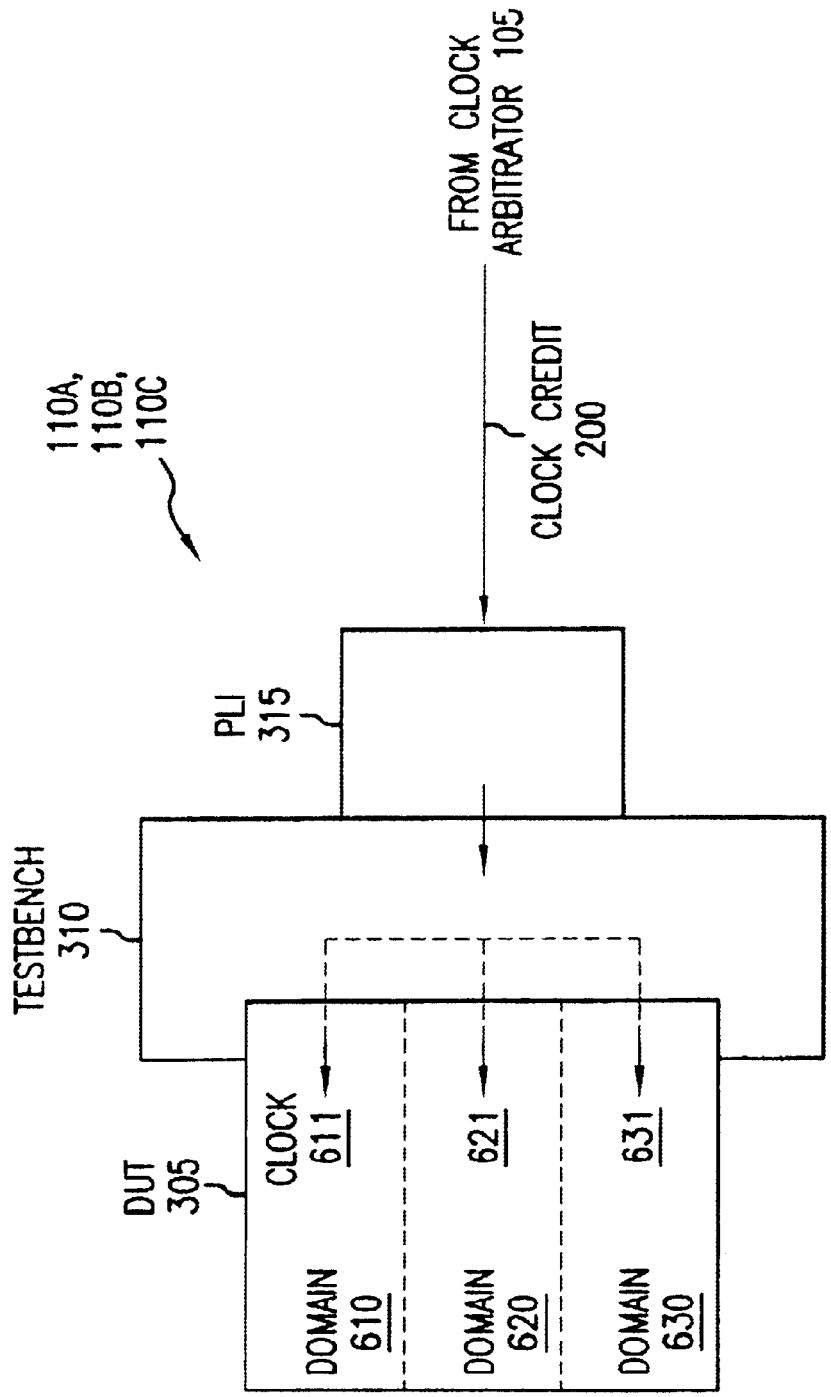
FIG. 6 illustrates the provision of clock signals of different rates to different clock domains, according to an embodiment of the invention.

The operation of process 500 is illustrated graphically in FIG. 6. A clock credit 200 is shown being received by PLI 315 from clock arbitrator 105. Test bench 310 is made aware of the receipt of the clock credit 200. Given that test bench 310 is aware of the required clock rates for the various clock domains of DUT 305, test bench 310 provides the necessary clock signals to the clock domains of DUT 305. In particular, test bench 310 provides a clock signal 611 to clock domain 610, provides a clock signal 621 to clock domain 620, and provides a clock signal 631 to clock domain 630. As described above, the various clock rates are created by dividing the master clock rate so as to create the needed clock signals.

Figure 7:
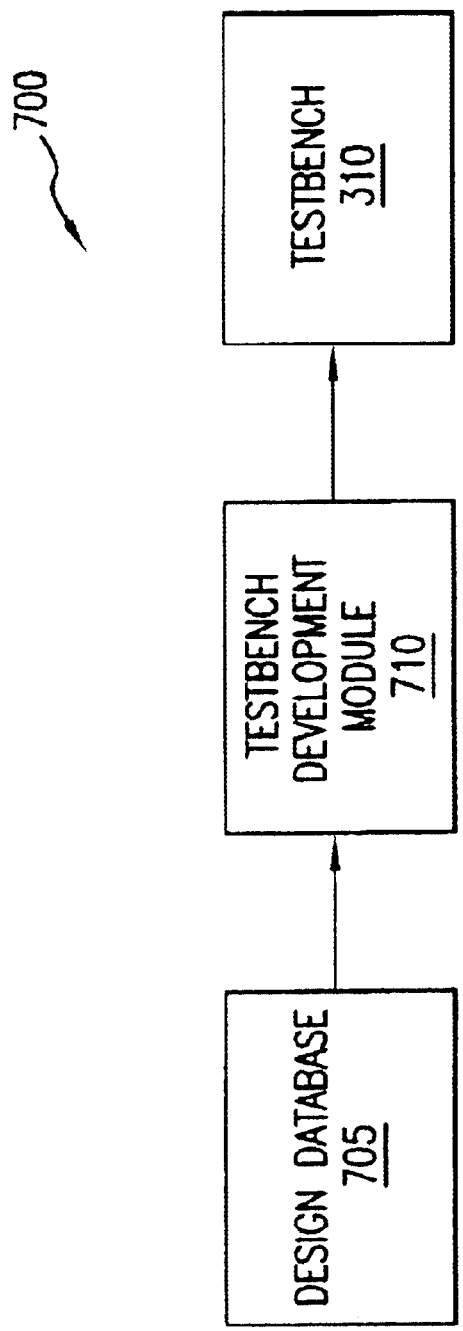
FIG. 7 illustrates generally the process of creating a test bench, according to an embodiment of the invention.

Note that a test bench specific to a DUT can be produced by automated means. This process is illustrated generally in FIG. 7. Assuming that all relevant system design information is encapsulated in a machine-readable form, the design information can be read to allow creation of a test bench specifically for each DUT of the system. The system design information can be encapsulated for example, in a design database 705. Design database 705 is read by a test bench development module 710. Test bench development module 710 steps through the design information and identifies each DUT, and ascertains the signals that must go into and come out of each DUT. As a result, a test bench 310 specific to a DUT can be created, where test bench 310 is tailored to manage the inputs and outputs required by the DUT.

Figure 8:
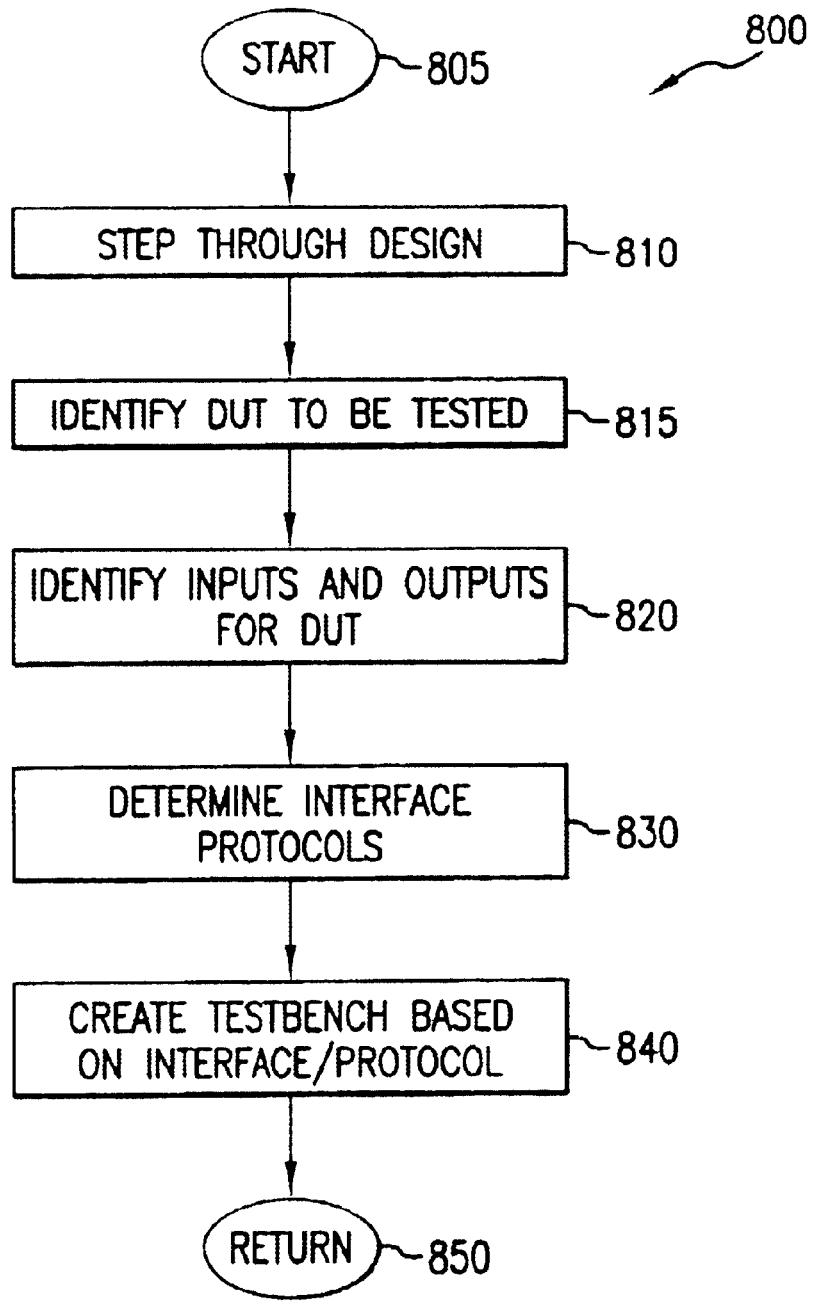
FIG. 8 is a flowchart illustrating in greater detail the process of creating a test bench, according to an embodiment of the invention.

The process of creating a test bench is illustrated in greater detail as process 800 of FIG. 8. The process begins with a step 805. In a step 810, the test bench development module steps through the design information. In a step 815, the test bench development module identifies a DUT to be tested. In a step 920 the inputs and outputs for the DUT, including clock signals, are identified. In a step 830 the protocols of the inputs and outputs are determined for the DUT. The inputs, outputs, and protocols collectively constitute the interface of the DUT. In a step 840, the test bench is created based on the inputs, outputs, and protocols. The process concludes with a step 850.

V. Environment

Figure 9:
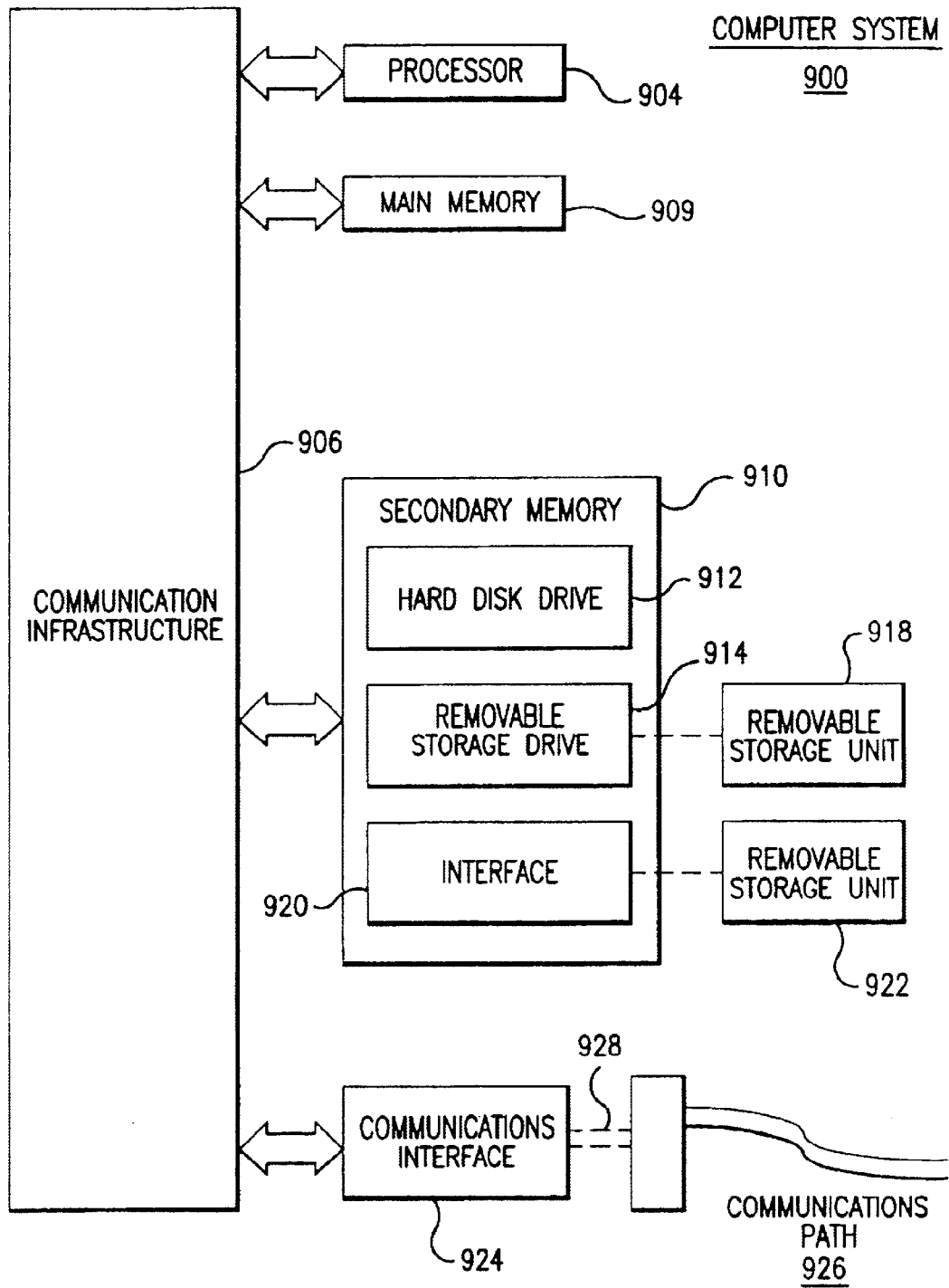
FIG. 9 illustrates an example computing environment of the invention.

The present invention may be implemented in a computer system or other processing system. An example of such a computer system 900 is shown in FIG. 9. The computer system 900 includes one or more processors, such as processor 904. The processor 904 is connected to a communication infrastructure 906, such as a bus or network). Various software implementations are described in terms of this exemplary computer system. After reading this description, it will become apparent to a person skilled in the relevant art how to implement the invention using other computer systems and/or computer architectures.

Computer system 900 also includes a main memory 908, preferably random access memory (RAM), and may also include a secondary memory 910. The secondary memory 910 may include, for example, a hard disk drive 912 and/or a removable storage drive 914, representing a floppy disk drive, a magnetic tape drive, an optical disk drive, etc. The removable storage drive 914 reads from and/or writes to a removable storage unit 918 in a well known manner. Removable storage unit 918, represents a floppy disk, magnetic tape, optical disk, or other storage medium which is read by and written to by removable storage drive 914. As will be appreciated, the removable storage unit 918 includes a computer usable storage medium having stored therein computer software and/or data.

In alternative implementations, secondary memory 910 may include other means for allowing computer programs or other instructions to be loaded into computer system 900. Such means may include, for example, a removable storage unit 922 and an interface 920. Examples of such means may include a program cartridge and cartridge interface (such as that found in video game devices), a removable memory chip (such as an EPROM, or PROM) and associated socket, and other removable storage units 922 and interfaces 920 which allow software and data to be transferred from the removable storage unit 922 to computer system 900.

Computer system 900 may also include a communications interface 924. Communications interface 924 allows software and data to be transferred between computer system 900 and external devices. Examples of communications interface 924 may include a modem, a network interface (such as an Ethernet card), a communications port, a PCM-CIA slot and card, etc. Software and data transferred via communications interface 924 are in the form of signals 928 which may be electronic, electromagnetic, optical or other signals capable of being received by communications interface 924. These signals 928 are provided to communications interface 924 via a communications path (i.e., charnel) 926. This channel 926 carries signals 928 and may be implemented using wire or cable, fiber optics, a phone line, a cellular phone link, an RF link and other communications channels.

In this document, the terms "computer program medium" and "computer usable medium" are used to generally refer to media such as removable storage units 918 and 922, a hard disk installed in hard disk drive 912, and signals 928. These computer program products are means for providing software to computer system 900.

Computer programs (also called computer control logic) are stored in main memory 908 and/or secondary memory 910. Computer programs may also be received via communications interface 924. Such computer programs, when executed, enable the computer system 900 to implement the present invention as discussed herein. In particular, the computer programs, when executed, enable the processor 904 to implement the present invention. Accordingly, such computer programs represent controllers of the computer system 900. Where the invention is implemented using software, the software may be stored in a computer program product and loaded into computer system 900 using removable storage drive 914, hard drive 912 or communications interface 924. Simulation modules 110A through 110C are implemented in software and can therefore be loaded into computer system 900 through any of these means. Likewise, clock arbitrator 105 can also be implemented in software and can therefore be loaded into computer system 900 through any of these means.

A test bench development module can also be implemented in software on a system such as computer system 900 and can therefore be loaded into computer system 900 through any of these means. In such an embodiment, information from design database 705 can be read into computer system 900 through interface 924 or read from secondary memory 910. Test bench 310 can likewise be output through interface 924, or stored in secondary memory 910.

VI. Conclusion

While various embodiments of the present invention have been described above, it should be understood that they have been presented by way of example, and not limitation. It will be apparent to persons skilled in the relevant art that various changes in detail can be made therein without departing from the spirit and scope of the invention. Thus the present invention should not be limited by any of the above-described exemplary embodiments, but should be defined only in accordance with the following claims and their equivalents.

What is claimed is:

1. A method of synchronizing a plurality of simulation modules, comprising the steps of:
   (a) issuing a clock credit to each simulation module;
   (b) creating a master clock signal;
   (c) dividing the master clock signal to derive an additional clock signal;
   (d) applying the additional clock signal to one of the plurality of simulation modules;
   (e) execution, by each simulation module, to an extent corresponding to the clock credit;
   (f-1) issuing an additional clock credit for each simulation module when the extent of execution corresponding to a prior clock credit has been completed, said issuing of an additional clock credit occurring in response to not detecting a synchronization point for synchronizing the plurality of simulation modules;
   (f-2) halting execution for each simulation module when the extent of execution corresponding to a prior clock credit has been completed, said halting occurring in response to detecting a synchronization point for synchronizing the plurality of simulation modules; and
   (g) when additional processing by at least one simulation module is necessary after execution of step (f-2), issuing a further clock credit to each simulation module.

2. The method of claim 1, wherein step (a) comprises the step of issuing clock credit to each simulation module on the basis of synchronization points identified in data passing between the simulation modules.

3. The method of claim 1, wherein said steps (b), (c), and (d) are performed by a test bench component of the simulation module.

4. The method of claim 3, further comprising, before said step (b), the step of:
   (h) creating a test bench component for the simulation module.

5. A system for synchronizing a plurality of simulation modules, comprising:
   a clock arbitrator;
   a programming language interface (PLI) for each simulation module from the plurality of simulation modules, wherein said PLI receives a clock credit from said clock arbitrator and enables and halts simulation module execution on the basis of synchronization points detected to synchronize the plurality of simulation modules; and
   a test bench component for each simulation module from the plurality of simulation modules, wherein said test bench component manages inputs and outputs to a device under test (DUT) within each simulation module.

6. A computer program product comprising a computer usable medium having computer readable program code that enables a computer to synchronize a plurality of simulation modules, said computer readable program code comprising:
   first computer readable program code logic for causing the computer to issue a clock credit to each simulation module;
   second computer readable program code logic for causing the computer to execute each simulation module to an extent corresponding to the clock credit;
   third computer readable program code logic for causing the computer to issue an additional clock credit for each simulation module when the extent of execution corresponding to a prior clock credit has been completed, wherein said additional clock credit is issued in response to not detecting a synchronization point for synchronizing the plurality of simulation modules;
   fourth computer readable program code logic for causing the computer to halt execution for each simulation module when the extent of execution corresponding to a prior clock credit has been completed, wherein execution is halted in response to detecting a synchronization point for synchronizing the plurality of simulation modules;
   fifth computer readable program code logic for causing the computer to issue a further clock credit to each simulation module when additional execution by at least one simulation module is determined to be necessary after execution of said fourth computer readable program code logic;
   sixth computer readable program code logic for causing the computer to create a master clock signal;
   seventh computer readable program code logic for causing the computer to divide the master clock signal to derive an additional clock signal; and
   eight computer readable program code logic for causing the computer to apply the additional clock signal to one of the plurality of simulation modules.

7. The computer program product of claim 6, wherein said first computer readable program code logic comprises logic for causing the computer to issue clock credit to each simulation module on the basis of synchronization points identified in data passing between the simulation modules.

8. The system of claim 5, wherein said test bench component and said DUT are compiled together as a single binary executable module.

9. The system of claim 5, wherein said clock arbitrator comprises a shared memory interface.

10. A method of synchronizing a plurality of simulation modules, comprising the steps of:
    (a) issuing a clock credit to each simulation module on the basis of synchronization points identified in data passing between the simulation modules;
    (b) creating a master clock signal;
    (c) dividing the master clock signal to derive an additional clock signal;
    (d) applying the additional clock signal to one of the plurality of simulation modules;
    (e) execution, by each simulation module, to an extent corresponding to the clock credit;
    (f) for each simulation module, halting execution when the extent of execution corresponding to the clock credit has been completed; and
    (g) when additional processing by at least one simulation module is necessary, issuing a further clock credit to each simulation module.

11. A method of synchronizing a plurality of simulation modules, comprising the steps of:
    (a) issuing a clock credit to each simulation module;
    (b) creating a test bench component for the simulation module;
    (c) creating, at said test bench component, a master clock signal;
    (d) dividing, at said test bench component, the master clock signal to derive an additional clock signal;
    (e) applying, at said test bench component, the additional clock signal to one of the plurality of simulation modules;

(e) execution, by each simulation module, to an extent corresponding to the clock credit;

(f) for each simulation module, halting execution when the extent of execution corresponding to the clock credit has been completed; and (g) when additional processing by at least one simulation module is necessary, issuing a further clock credit to each simulation module.

12. A computer program product comprising a computer usable medium having computer readable program code that enables a computer to synchronize a plurality of simulation modules, said computer readable program code comprising:

first computer readable program code logic for causing the computer to issue a clock credit to each simulation module on the basis of synchronization points identified in data passing between the simulation modules;

second computer readable program code logic for causing the computer to execute each simulation module to an extent corresponding to the clock credit;

third computer readable program code logic for causing the computer to halt execution of a simulation module when the simulation module has completed execution to an extent corresponding to the clock credit;

fourth computer readable program code logic for causing the computer to issue a further clock credit to each simulation module to perform additional execution by at least one simulation module;

fifth computer readable program code logic for causing the computer to create a master clock signal;

sixth computer readable program code logic for causing the computer to divide the master clock signal to derive an additional clock signal; and seventh computer readable program code logic for causing the computer to apply the additional clock signal to one of the plurality of simulation modules.

* * * * *